(12) United States Patent
Kerr et al.

(10) Patent No.: US 6,172,522 B1
(45) Date of Patent: Jan. 9, 2001

(54) SLEW RATE CONTROLLED PREDRIVER CIRCUIT

(75) Inventors: Michael Kevin Kerr, Johnson City; William Frederick Lawson, Vestal, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/333,725

(22) Filed: Jun. 15, 1999

Related U.S. Application Data (63) Continuation-in-part of application No. 09/132,803, filed on Aug. 13, 1998.

(51) Int. Cl.$^7$ .................................................. H03K 19/00
(52) U.S. Cl. .................................. 326/58; 326/83; 326/57
(58) Field of Search .................................. 326/56, 57, 58, 326/83, 86, 119, 112, 121

(56) References Cited

U.S. PATENT DOCUMENTS

| | | | |
|---|---|---|---|
| 4,217,502 | * 8/1980 | Suzuki et al. | 307/205 |
| 4,638,187 | * 1/1987 | Boler et al. | 307/451 |
| 4,724,340 | * 2/1988 | Sood | 307/443 |
| 4,731,553 | * 3/1988 | Van Lehn et al. | 307/443 |
| 4,800,298 | * 1/1989 | Yu et al. | 307/443 |
| 4,859,877 | * 8/1989 | Cooperman et al. | 307/443 |
| 5,041,738 | * 8/1991 | Walters, Jr. | 307/269 |
| 5,099,148 | * 3/1992 | McClure et al. | 307/443 |
| 5,311,076 | * 5/1994 | Park et al. | 307/443 |
| 5,381,059 | * 1/1995 | Douglas | 326/58 |
| 5,594,370 | * 1/1997 | Nguyen et al. | 326/86 |
| 5,969,554 | * 10/1999 | Chan et al. | 327/170 |

\* cited by examiner

Primary Examiner—Michael Tokar
Assistant Examiner—Anh Tran
(74) Attorney, Agent, or Firm—John R. Pivnichny (57) ABSTRACT

A digital CMOS predriver circuit pulls an output node up and down with accurately controlled rise and fall times in the threshold region. Resistors independently set rise and fall slew rates while additional CMOS devices initially charge and discharge the output node. The additional devices turn off before the output reaches the threshold region.

12 Claims, 6 Drawing Sheets

SLEW RATE CONTROLLED PREDRIVER CIRCUIT

CROSS REFERENCE TO RELATED APPLICATION

This application is a continuation-in-part of application Ser. No. 09/132,803 filed Aug. 13, 1998.

TECHNICAL FIELD

The invention relates to CMOS circuits and particularly to predriver circuits which preceed off-chip drivers. Even more particularly the invention relates to CMOS predriver circuits which include a capability of pulling an output node up or down in a controlled fashion. The output node may control an input of a following off-chip driver.

BACKGROUND OF THE INVENTION

Semiconductor chips which contain CMOS logic circuits are well known and widely used throughout the electronic industry because of their inherent high speed performance with relatively low power consumption. A single CMOS logic chip may have over one million individual CMOS devices of both PFET AND NFET type interconnected to form logic circuits e.g. logic gates which are then further interconnected to form various logic functions. The individual CMOS devices are intentionally made as small as possible in order to minimize the total semiconductor chip size and therefore the cost of a chip.

While the CMOS logic circuits are freely interconnected on a chip, when a logic signal must be sent to another chip, then additional driving power is required. Special driver circuits using much larger PFET AND NFET drivers are constructed on the chip in order to handle the increased driving power needed. A driver circuit may need to drive a transmission line with or without terminations. The transmission line may be part of a bus with multiple drivers connected or tapped on at various points, each one increasing the load capacitance which must be driven.

In addition, each driver must normally be capable of entering a tristate mode when not active in order to prevent a conflict with another driver on the bus which is currently active. The driver may also need to provide a termination for the transmission line a described in U.S. Pat. No. 4,859,877 which is incorporated by reference herein.

The driver circuits are of such a high power that they can not be driven directly by ordinary logic gates on the CMOS chip and accordingly a predriver circuit is used between the output of an ordinary logic gate on the chip and the inputs of a driver circuit. As shown in U.S. Pat. No. 5,381,059 there are usually two inputs to a driver circuit, one for the large NFET pull-down device and one for the large PFET pull-up device.

The predriver circuit therefore has two outputs and two or more inputs. The inputs are the data signal, a tristate mode signal and optionally various enable signals or signals to provide a termination function for cases where the driver is located at the end of a transmission line.

Driving the gate of a large PFET pull-up device of the driver circuit to an up level is a problem for a predriver circuit. In order to rapidly pull the gate of the driver PFET device to the upper supply rail, a relatively large PFET device is needed in the predriver circuit. Larger devices tend to be slower so that increasing the predriver PFET size to increase pull-up current does not necessarily result in faster operation.

Driving the gate of a large NFET pull-down device of a driver circuit to a down level is also a problem for a predriver circuit for similar, but complementary, reasons just described.

In cases where supply current transients are more important than operating speed, such as occurs with packages having a relatively large supply inductance, pull up action is intentionally delayed to reduce the effect of noise on other circuits. Boler et al. in U.S. Pat. No. 4,638,187, Yu et al. in U.S. Pat. No. 4,800,298, and Sood in U.S. Pat. No. 4,724,340 all use a PFET driven by an inverted delayed signal, in parallel with an NFET as a pull-up which reduces supply transients. Walters, Jr. in U.S. Pat. No. 5,041,738 uses programmable fuses to control the delay of the rise of a pull-up circuit.

The overall operating speed of a system with the predrive-driver combination is limited by both the slew rate and delay of the driver circuit as well as the time required to enter and return from tristate mode. Usually this mode switching becomes the limiting factor. Therefore it would be advantageous to match the mode switching speed to the operational switching speed so that neither one imposes a significant limitation.

In other applications it is important to control the overall operating speed of a predrive-driver system by providing a high speed but controlled slew rate of both the rising and falling edges of the predriver output. It is especially advantageous to control the slew rate during transition through the threshold region of a following PFET driver device.

In accordance with the teachings of the present invention, there is defined a new CMOS predriver circuit which includes capability for rapid pull-up of the gate of a driver PFET device and capability for matching mode switching speed to operational speed. It is believed that such a circuit constitutes a significant advancement in the art.

In accordance with other teachings of the present invention there is defined a new CMOS predriver circuit for pulling an output node up or down in a controlled fashion. The output node may be used to drive the gate of a driver NFET or PFET device. It is believed that such a circuit constitutes a significant advancement in the art.

OBJECTS AND SUMMARY OF THE INVENTION

It is therefore a principal object of the present invention to enhance the semiconductor circuit art by providing a digital circuit with enhanced pull up and pull down capabilities.

It is a further object to provide a CMOS predriver circuit wherein enhanced predrive capabilities are possible.

It is yet another object of the invention to provide a predriver/driver circuit combination with enhanced capabilities.

These and other objects are attained in accordance with one embodiment of the invention wherein there is provided a digital circuit for pulling an output node up or down in a controlled fashion, the digital circuit comprising, a first PFET having a source, a drain, and a gate, a first resistor with one end connected to the drain of the first PFET, a second PFET having a source connected to a second end of the first resistor, a drain connected to the output node, and a gate, a first NFET having a drain connected to the first PFET, a source connected to the output node, and a gate, a second NFET having a drain connected to the output node, a source, and a gate, a second resistor with one end connected to the source of the second NFET and the other end connected to a ground terminal, a third PFET having a source connected to the output node, a drain connected to the ground terminal and a gate, and means for simultaneously activating the gates of the NFET's and PFET's to pull up and pull down the output node.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
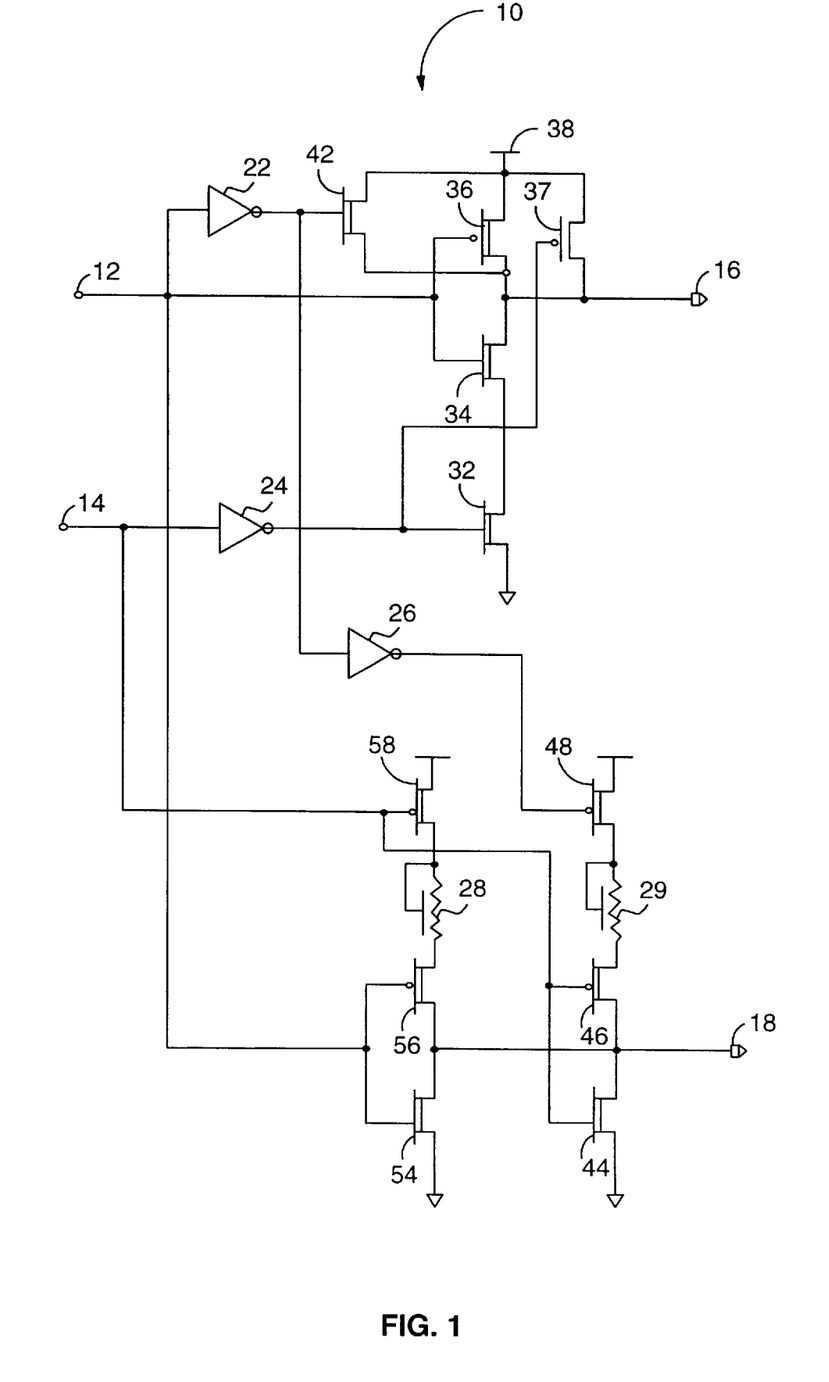
FIG. 1 is a circuit diagram of a predriver illustrating one embodiment of the present invention.

In FIG. 1 there is shown a circuit diagram of a CMOS predriver circuit 10 in accordance with one embodiment of the present invention. The predriver circuit accepts data input 12 and tristate control input 14. PFET Drive output 16 and NFET Drive output 18 are driven by the predriver circuit 10 in accordance with the following description. In normal operation outputs 16 and 18 would be connected to a complimentary pair of high power PFET and NFET devices respectively of a following driver circuit (for example see FIG. 3 described below) as is well known in the art. Other uses of outputs 16 and 18 are possible, however, and the operation of predriver circuit 10 can be understood without further reference to whatever circuit is being driven by these outputs. Output 16 is driven by a complementary CMOS pair, PFET 36 and NFET 34 which are in turn driven simultaneously at their gates directly by data input 12. An additional NFET 32, connected between the source of NFET 34 and ground, is turned on by inverter 24 when tristate input 14 is not active e.g. input 14 is at a down level. However, when tristate operation is desired input 14 is brought to an up level, turning off NFET 32 via inverter 24, interrupting current flow through NFET 34 and activating PFET 37.

As stated in the background, PFET 36 must be relatively large in order to rapidly drive any following driver PFET device gate to an up level. However increasing the size of PFET 36 slows down its own operation, eventually defeating the purpose of any such size increase beyond some limit. In order to further increase the speed of pulling up output 16, NFET 42 is placed in parallel with PFET 36. However NFET 42 is driven by the output of inverter 22, which inverts with minimal delay the data input signal used to operate the gate of PFET 36. NFETs are known in the art to have a higher gain than PFETs so NFET 42 can be made significantly smaller than PFET 36 would be if used by itself and still provide a faster initial pullup of output node 16.

The ability of NFET 42 to pull node 16 up is limited to a maximum positive voltage which is less that positive supply 38. If the gate of NFET 42 is driven to the positive supply by inverter 22, then NFET 42 will stop drawing current as the voltage on it source e.g. the voltage on node 16 approaches one threshold voltage below the gate voltage. PFET 36 however continues to draw current taking node 16 to the positive supply value. For this reason, PFET 36 is retained in the embodiment of FIG. 1.

Figure 3:
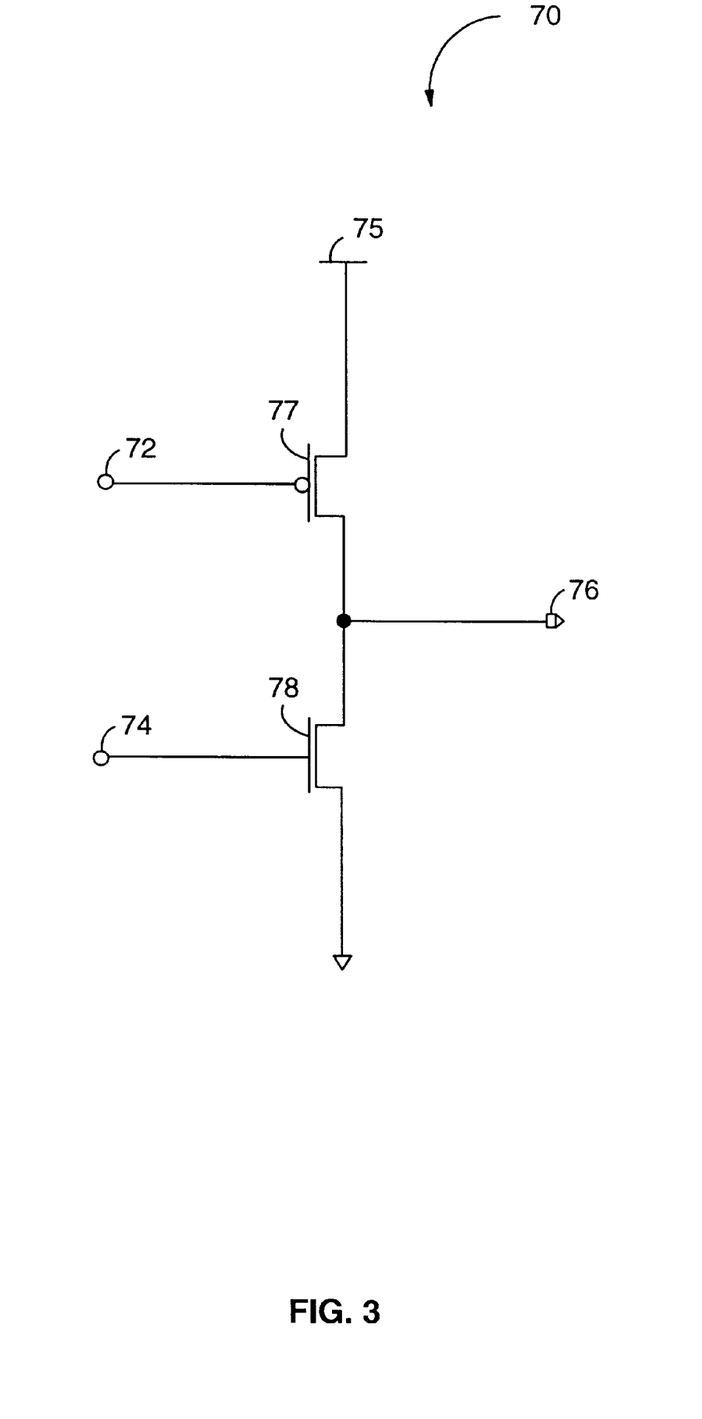
FIG. 3 is a circuit diagram of a CMOS driver which may follow the predriver circuits of FIGS. 1, 2, 4, or 5.

In another embodiment, a driver circuit, such as shown in FIG. 3, following the predriver of the present invention may be operated from a lower positive supply 75 than the predriver positive supply 38. For example, a driver may be designed to operate with a lower voltage bus, or interface to a lower voltage semiconductor part, while internal circuits and predrivers are operated at a higher voltage to optimize on-chip performance. There is no need to pull node 16 to positive supply 38 in this embodiment but just to positive supply 75. This may be within the capability of NFET 42 alone and PFET 36 can be eliminated without departing from the scope of the present invention.

Output node 18 has two driving paths. First, complimentary CMOS pair PFET 56 and NFET 54 are in turn driven at their gates directly by the data input 12. An additional PFET 58 can disable this path when tristate input 14 is activated to an up level. When tristate input 14 is inactive, resistive element 28, connected between the drain of PFET 58 and the source of PFET 56, controls the rate at which output node 18 is pulled up as data input 12 goes to a down level. Secondly, complimentary CMOS pair PFET 46 and NFET 44 are in turn driven by tristate input 14. An additional PFET 48 disables this path whenever data input 12 is in an up level. The gate is PFET 48 is not driven directly by data input 12 but instead is driven by a delayed data signal obtained by inverting the output of inverter 22 with a second inverter 26. When data input 12 is in a down level, resistive element 29, connected between the source of PFET 48 and the drain of PFET 46 controls the rate at which output node 18 is pulled up as tristate input 14 goes to a down level, i.e. the circuit is brought out of tristate mode. The relative and absolute resistive value of resistive elements 28 and 29 are selected to balance the delay of turning on a driver, such as NFET 78 of FIG. 3, during data transitions and when leaving tristate mode. PET 46 operates more rapidly than PET 58 at pulling up output 18 when leaving tristate mode because the current supplied by PFET 46 feeds node 18 directly while that from PFET 58 must first pass through resistive element 28 and PFET 56 before passing to node 18. The data input drive to PFET 48 is delayed to reduce its influence while out of tristate mode, so that PFET 56 will operate more rapidly to control pull up of node 18.

Figure 2:
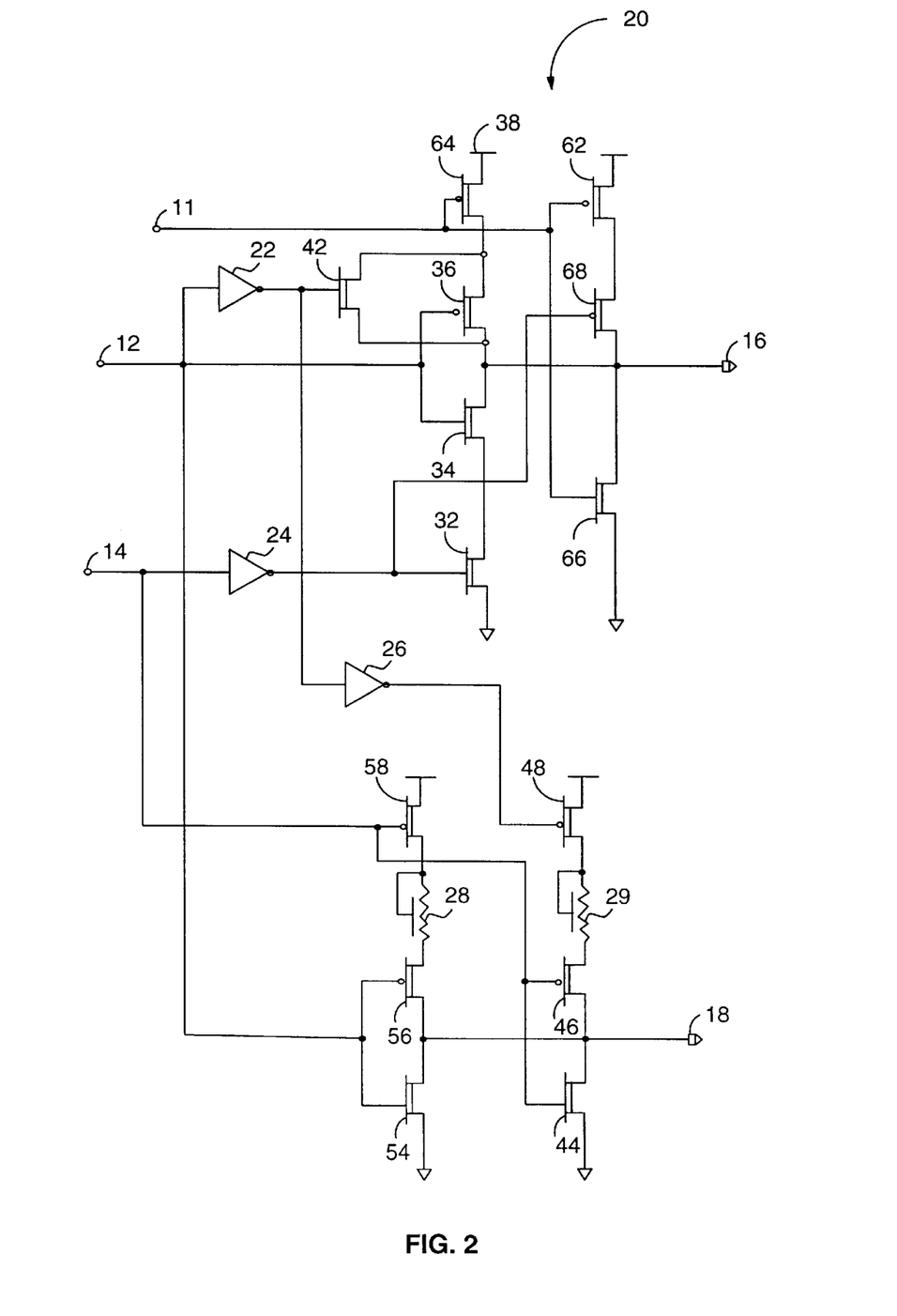
FIG. 2 is a circuit diagram of a predriver in accordance with another embodiment of the present invention.

Another embodiment of the invention, predriver 20, is shown in the circuit diagram of FIG. 2. An additional enable input 11 is added to allow further logical control of the operation of output 16. Enable input 11 is active when in a down level, supplying current via PFET 64 to PFET 36 and NFET 42 which then operate as described above. PFET 62 can at the same time supply current to PFET 68 which during tristate mode pulls node 16 to an up level effectively disabling a driver PFET such as PFET 77 shown in FIG. 3. When enable input 11 is driven to an up level, i.e. disabled, NFET 66 pulls output 16 down as is logically desirable in this embodiment.

FIG. 3 shows a driver circuit 70 which may be used following the predrivers of FIGS. 1 and 2. If used, input 72 is connected to output node 16 and input 74 to output node 18. A high current PFET 77 and complementary high current NFET 78 drive accessible node 76. Driver circuit 70 is preferably located on the same semiconductor chip and in close proximity to predriver circuit 10 or 20. Accessible node 76 is preferably an input/output connection to the chip such as may be provided in the form of a wire bonding pad or C4 connection pad. A transmission line matching resistor (not shown) may be placed in series with accessible node 76, either on or off chip, in order to provide a proper impedance termination for an external net.

Figure 4:
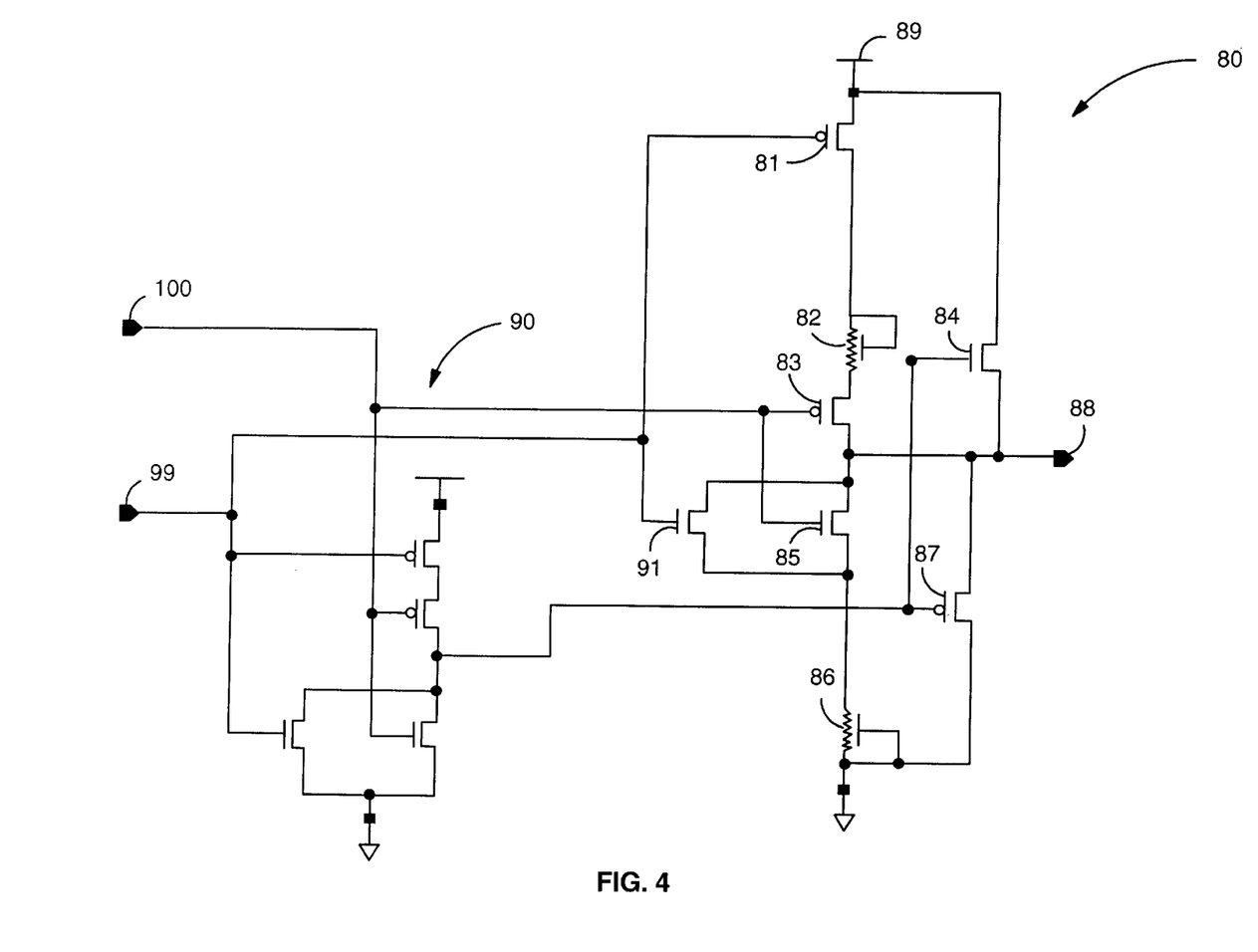
FIG. 4 is a predriver circuit diagram illustrating the present invention.
Figure 5:
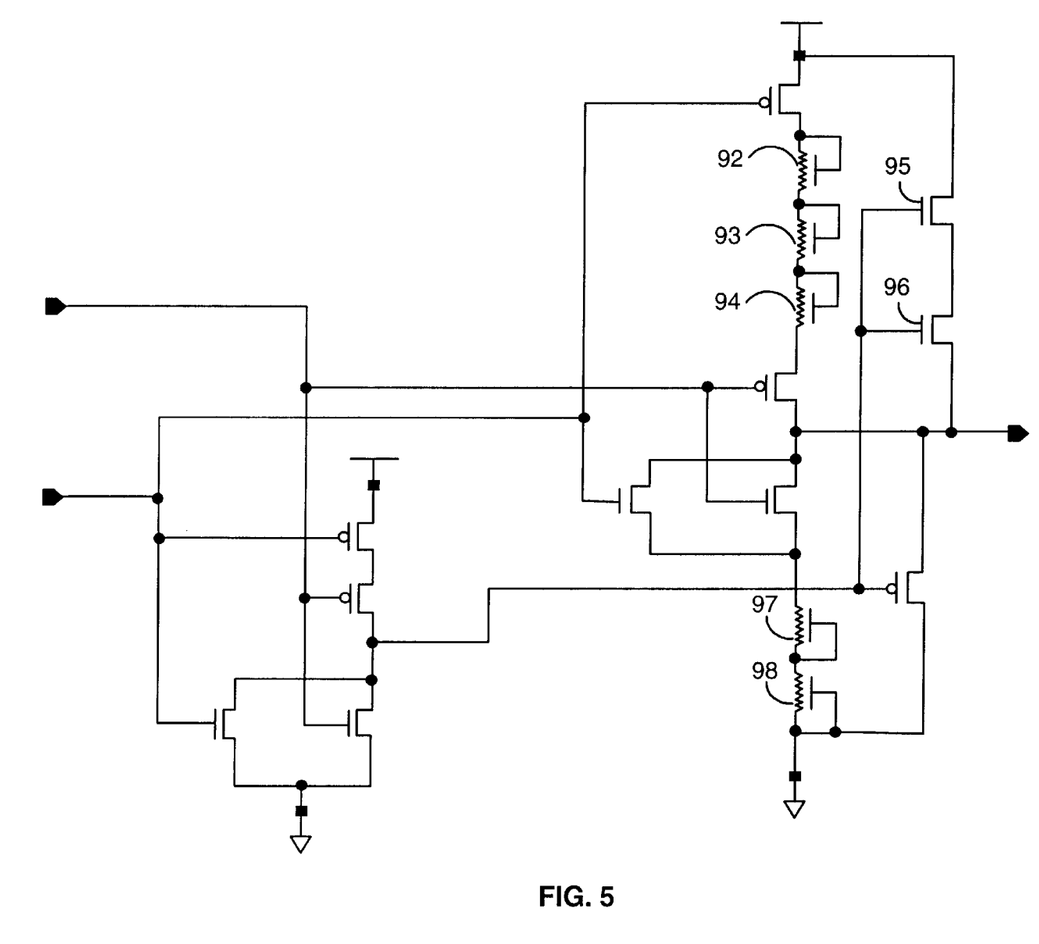
FIG. 5 is a circuit diagram of a predriver in accordance with another embodiment of the present invention.

In FIG. 4 is shown another embodiment of the invention. A predriver circuit 80 accepts data input 100. NFET Drive output 88 is driven by the predriver circuit 80 in accordance with the following description. In normal operation, output 88 would be connected to the NFET 78 of a complementary pair of high power PFET 77 and NFET 78 devices of a following driver circuit such as 70 of FIG. 3. Other uses of output 88 are possible, however, and the operation of predriver circuit 80 can be understood without further reference to whatever circuit is being driven by this output. Output 88 is driven by PFET 83 and NFET 85. Resistor 82 controls the rate of pull up and resistor 86 controls the rate of pull down. As signal 100 goes low, PFET 83 begins to pull output 88 up which if connected to NFET 78 would eventually turn on NFET 78. The size of PFET 83, resistor 82, and PFET 81 determine the RC time constant of the path from output 88 to positive supply 89. The longer this time constant, the slower output 88 will rise and the slower NFET 78 turns on. However, PFET 83 must charge the large capacitance associated with PFET 81 and resistor 82 as well as any load capacitance on output 88 all of which add delay to this path. NFET 84 reduces this delay because it does not see all of the capacitance seen by PFET 83. NFET 84 is driven from data input 100 through an inverting circuit such as nor gate 90. NFET 84 immediately begins pulling output 88 up until it reaches one threshold voltage below positive supply 89, then shuts off and PFET 83 takes over. It is also possible to place two or more NFET devices in series as shown in FIG. 5 elements 95 and 96. In this case the NFET's will shut off when output 88 rises to within two threshold levels of positive supply 89. The point at which the NFET's shut off and PFET 83 takes over can be set by selecting the number of series NFET'S. In this way, the operation of predriver circuit is tailored to have a rise time controlled by the RC constant of the PFET 83 and resistor 82 path in the region of the threshold of whatever the device is attached to output 88. Resistor 82 may be a single resistor as shown in FIG. 4 or a series combination shown as 92, 93, and 94 of FIG. 5 without departing from the invention and operation just described.

In a complementary manner, NFET 85 and resistor 86 control the fall time as output 88 is pulled down through the threshold region. Resistor 86 may be formed from two or more resistors such as shown in FIG. 5 as resistors 97 and 98. In addition PFET 87 immediately starts to pull output 88 down as data input 100 goes high. However, as output 88 approaches one threshold above ground, PFET 87 turns off and the RC time constant of the NFET 85 resistor 86 path controls the fall time of output 88 through the threshold region. An enable circuit comprising PFET 81, NFET 91 and enable input 99 may be included as a part of predriver circuit 80 as shown in FIG. 5.

The use of NFET 84 and PFET 87 to provide rapid initial charging and discharging along with the controlled RC rise and fall times associated with PFET 83 and NFET 85 paths through the threshold region as described therefore provide an improved predrive circuit.

Figure 6:
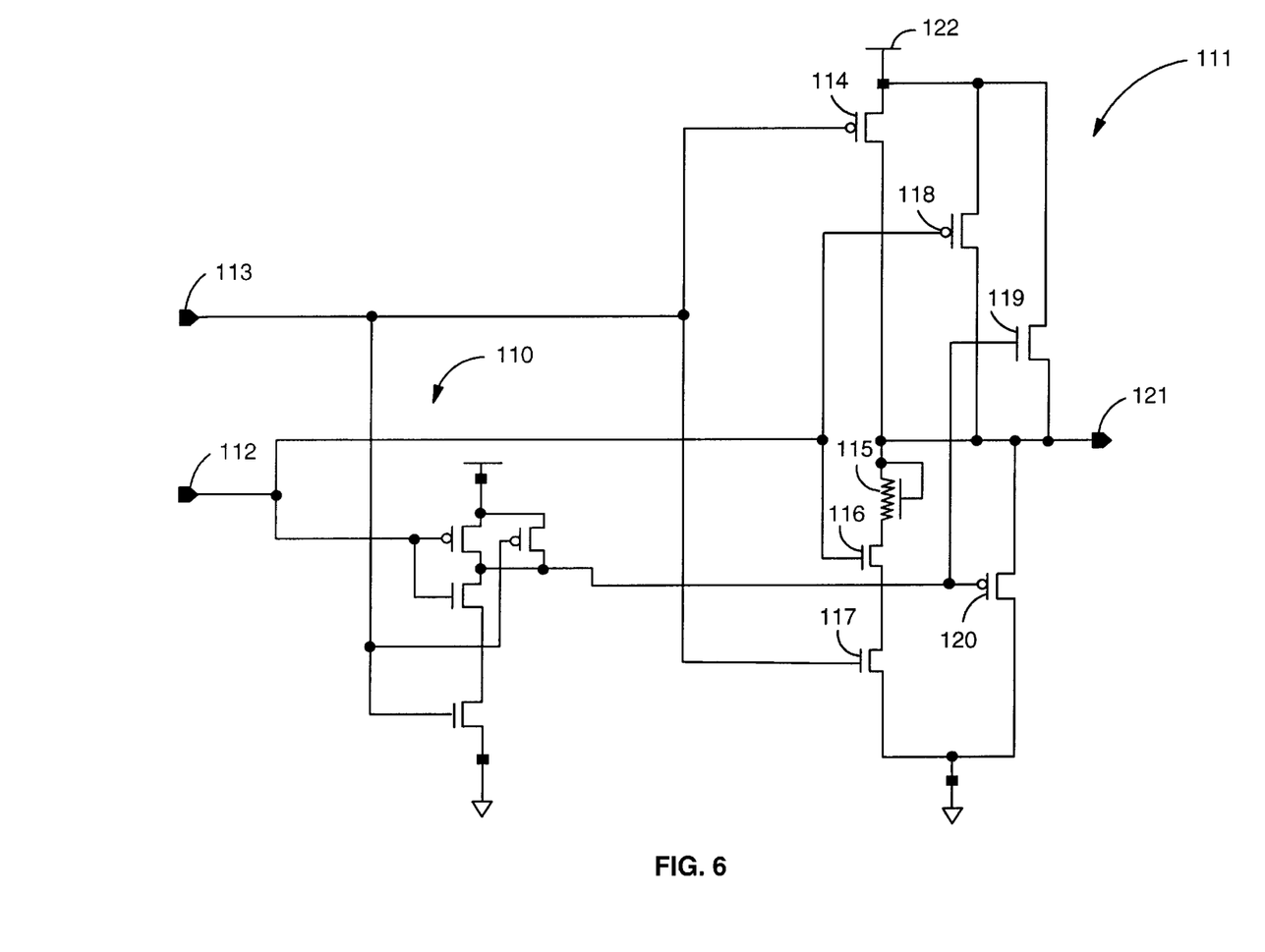
FIG. 6 is a circuit diagram of a predriver for a PFET gate.

In FIG. 6 there is shown a predriver circuit 111 comprising PFET's 118, and 120, NFETS 116, 117, and 119, and resistor 115, which can be used to pull down a PFET driver gate in a controlled but complementary fashion as the predriver circuits of FIGS. 4 and 5 are used to pull up a NFET driver gate. Output node 121 of predriver 111 can be connected to PFET input 72 of the driver of FIG. 3 while output node 88 of FIG. 4 is connected to NFET input 74 of FIG. 3. Voltage supply 122 can be equal to, higher, or slightly lower than voltage supply 75 of FIG. 3. PFET 120 provides a significant delay advantage when voltage supply 122 is higher than supply 75 of FIG. 3 because PFET 120 can initially pull node 121 down to the threshold region much faster than NFETs 116, 117, and resistor 115. Data inputs 112 and 99 and enable inputs 113 and 100 of FIGS. 6 and 4 respectively are connected in parallel thereby providing a controlled push-pull predrive to both inputs of the driver circuit of FIG. 3 in accordance with another embodiment of the present invention.

The invention as disclosed in the embodiments described above is therefore deemed to constitute a significant advancement in the art.

While there has been shown and described what are at present considered the preferred embodiments of the invention, it will be obvious to those skilled in the art that various changes and modifications may be made therein without departing from the scope of the invention as defined by the appended claims.

What is claimed is:

1. A digital circuit for pulling an output node up or down in a controlled fashion, said digital circuit comprising:
   a first PFET having a source, a drain, and a gate;
   a first resistor with one end connected to said drain of said first PFET;
   a second PFET having a source connected to a second end of said first resistor, a drain connected to said output node, and a gate;
   a first NFET having a drain connected to said source of said first PFET, a source connected to said output node, and a gate;
   a second NFET having a drain connected to said output node, a source, and a gate;
   a second resistor with one end connected to said source of said second NFET and the other end connected to a ground terminal;
   a third PFET having a source connected to said output node, a drain connected to said ground terminal and a gate; and
   means for simultaneously activating said gates of said NFET's and PFET's to pull up and pull down said output node.

2. The digital circuit of claim 1 wherein said source of said first PFET is connected to a positive voltage supply.

3. The digital circuit of claim 1 wherein said first resistor comprises a plurality of resistors connected in series between said one end and said second end.

4. The digital circuit of claim 1 wherein said first NFET comprises two individual NFET devices connected source to drain and gate to gate.

5. The digital circuit of claim 1 wherein said second resistor comprises a plurality of resistors connected in series between said one end and said other end.

6. The digital circuit of claim 1 wherein said means for simultaneously activating said gates of said NFET's and PFET's comprises an inverting circuit with input connected to said second PFET gate and output connected to said third PFET gate.

7. The digital circuit of claim 6 further comprising a third NFET having a drain and source connected to said drain and source respectively of said second NFET and a gate connected to an enable input.

8. A circuit in accordance with claim 2 further comprising a PFET device having a source connected to a second positive voltage supply, a drain connected to an accessable node and a gate connected to said output node.

9. The circuit of claim 8 wherein said second positive voltage supply is substantailly less than said positive voltage supply.

10. The circuit of claim 8 wherein all said PFET's and NFET's, said resistors, and said connections are positioned on a single semiconductor chip.

11. The circuit of claim 10 wherein said accessable node is an input/output pad of said semiconductor chip.

12. A plurality of circuits in accordance with claim 11 located on two or more separate semiconductor chips wherein said accessable node of each said cirucit is connected to said accessable node of all other said circuits of said plurality of circuits.

* * * * *